United States Patent [19]

Nicolay et al.

[11] 4,255,207

[45] Mar. 10, 1981

[54] FABRICATION OF ISOLATED REGIONS FOR USE IN SELF-ALIGNING DEVICE PROCESS UTILIZING SELECTIVE OXIDATION

[75] Inventors: Hugh C. Nicolay, Melbourne Village; William G. Lucas, Indian Harbor Beach, both of Fla.

[73] Assignee: Harris Corporation, Melbourne, Fla.

[21] Appl. No.: 28,289

[22] Filed: Apr. 9, 1979

[51] Int. Cl.³ ................... H01L 21/76; H01L 27/10
[52] U.S. Cl. ................... 148/174; 29/576 W; 29/577 C; 29/578; 29/580; 148/175; 148/187; 156/647; 156/648; 156/649; 156/657; 357/50; 357/55; 357/59; 427/86; 427/93
[58] Field of Search ................ 148/174, 175, 187; 29/576 W, 577 C, 578, 580; 156/647, 648, 649, 657, 662; 357/50, 55, 59; 427/86, 93, 96

[56] References Cited

U.S. PATENT DOCUMENTS

| 3,500,139 | 3/1970 | Frouin et al. | 148/175 X |
| 3,844,858 | 10/1974 | Bean | 156/647 X |
| 3,883,948 | 5/1975 | Allison | 29/580 X |
| 3,911,562 | 10/1975 | Youmans | 29/580 X |
| 3,913,124 | 10/1975 | Roberson | 357/50 X |
| 3,966,501 | 6/1976 | Nomura et al. | 148/187 X |
| 3,979,237 | 9/1976 | Morcom et al. | 357/50 X |
| 3,998,673 | 12/1976 | Chow | 156/657 X |
| 4,038,110 | 7/1977 | Feng | 148/175 X |
| 4,048,649 | 9/1977 | Bohn | 357/59 X |

FOREIGN PATENT DOCUMENTS 52-35987  3/1977  Japan ......................... 357/55

*Primary Examiner*—R. Dean
*Assistant Examiner*—W. G. Saba
*Attorney, Agent, or Firm*—Leitner, Palan, Martin & Bernstein

[57] ABSTRACT

V-shaped lateral dielectric isolation grooves divide a semiconductor layer into a plurality of regions. The oxide layer above the polycrystalline material in the grooves is thicker than the field oxide layer on the semiconductor layer to prevent the creation of retrograde surface profiles and mask the polycrystalline material during self-aligned device fabrication in the semiconductor layer. The field oxide is formed on the semiconductor layer before the isolation groove fabrication and prevented from increasing in thickness by an oxide inhibiting layer during the isolation groove fabrication.

9 Claims, 9 Drawing Figures

FABRICATION OF ISOLATED REGIONS FOR USE IN SELF-ALIGNING DEVICE PROCESS UTILIZING SELECTIVE OXIDATION

BACKGROUND OF THE INVENTION

The present invention relates generally to semiconductor devices and the processes of their fabrication and more specifically to fabrication of an improved laterally dielectrically isolated surface region for use in fabricating self-aligned semiconductor devices.

Integrated circuits are generally fabricated as a multiplicity of interconnected devices such as diodes and transistors formed side by side within a monolithic body of semiconductor material often called a semiconductor wafer. To prevent unwanted interaction, it is common practice to provide some form of electrical isolation barrier between the devices. The isolation may be achieved by providing PN junctions between the devices which are readily reverse-biased to preclude current flow across the junction or include dielectric barriers.

While known PN junction isolation techniques have proven successful, they suffer certain disadvantages in that they severely limit the surface area of the semiconductor body available for device fabrication. Since the lateral isolation region is formed by diffusion, the impurities spread vertically and laterally in the substrate. Thus, the PN junction spreads towards the devices which are to be isolated. It is essential that the isolation junction not come in contact with the device to be isolated, and therefore, sufficient space must be provided between devices to account for this lateral spreading.

Another known technique for device isolation, termed the Isoplanar technique involves the deposition of a silicon nitride film on the semiconductor surface, the etching of grooves through the film and into the semiconductor body, followed by thermal growth of silicon dioxide to fill the grooves. The silicon nitride film retards the growth of the oxide other than in the grooves. After the grooves are filled, the silicon nitride film is etched away to leave oxide isolated semiconductor islands with a planar surface. Since the grooves are filled with oxide by thermal oxidation, the depth of the grooves and consequently the thickness of the semiconductor layer to be isolated by the process are limited. Additionally, since the isolation region is formed by oxidation, the oxide-semiconductor boundary spreads vertically and laterally in the substrate towards the devices which are to be isolated.

A more desirable isolation technique, which can be termed Poyplanar, is described in U.S. Pat. No. 3,979,237 issued Sept. 7, 1976, to Morcom et al. According to the Polyplanar isolation technique a thin film of protective material is deposited on the planar surface of a semiconductor wafer in which integrated circuits are to be fabricated. A mask conforming to the desired isolation pattern is provided over the exposed surface of the protective thin film and isolation grooves are etched through the film and into the semiconductor material. The grooves are of a sufficient depth to define the regions within which devices are to be fabricated. An insulator layer such as a film of silicon dioxide is then formed over the surfaces of the grooves. The remaining portions of the grooves are then filled with pyrolytically deposited dielectric material or other fill material capable of withstanding subsequent high temperature processing to the level of the original planar surface of the semiconductor body. Due to limitations in the manufacturing process, the fill material will overfill the grooves and will coat surfaces other than the grooves themselves. The protective thin film functions to allow the excess fill material to be removed from the surface of the semiconductor wafer without damaging the underlying planar surface of the semiconductor material. After removal of the excess fill material, the thin film is removed by etching to expose a planar surface of isolated semiconductor islands. A full and complete description of this Polyplanar isolation process is given in the aforementioned patent to Morcom et al and the reader is directed to that patent for a full understanding of this isolation process.

A major disadvantage of the Polyplanar isolated substrate is the inability to use the isolation regions as a self-aligning region for the formation of doped regions in the substrate. A substrate isolated according to the process of the Morcom, et al., patent is illustrated in FIG. 1 as including a substrate 10, a buried layer 12, an epitaxial layer 14, and a groove 16 having an oxide layer 18 and polycrystalline material 20. By subsequent processing, an oxide layer 22 has been formed over the substrate having a thickness over the polycrystalline material 20 no greater than the thickness over the epitaxial regions 14. An opening 24 is formed in oxide layer 22 into which impurities are to be diffused to form a doped region or to which metal contact to the epitaxial regions 14 are to be formed. The opening 24 is formed using a photolithographic technique including an oxide etch. Because the oxide layer 22 is of equal thickness over the epitaxial layer 14 and the polycrystalline material 20, a slight over etch of the oxide layer 22 in the formation of opening 24 will remove a portion of oxide layer 18 exposed to the etching medium in opening 24. The inadvertent removal of a portion of oxide layer 18 at the surface of the structure will create a retrograde surface profile 26 where the upper corner of the polycrystalline is exposed by the etching of opening 24.

This retrograde surface profile 26 is undersirous and upon further oxidation will not be eliminated. Any subsequent metalization interconnect patterns formed by the evaporation, sputtering or other deposition techniques followed by a photolithographic operation will result in an undesirous cavity 28 in the metal layer as it passes over the retrograde surface profile 26. This results from the metal etch solution seeping laterally in the groove of the retrograde surface profile 26 and etching the metal cavity 28. Additionally, if the opening 24 is for the purpose of making contact to the epitaxial layer 14 by the metal layer, contact is inadvertently also made to the polycrystalline material 20. If opening 24 is for the purpose of forming a doped region in epitaxial layer 14, a doped region in the polycrystalline material 20 is simultaneously created which may not be desired. For instance, it may be desired to utilize the polycrystalline material as a resistive element having an impurity doping different from the doped semiconductor material.

SUMMARY OF THE INVENTION

The present invention overcomes the problems of the prior art by providing an oxide layer above the polycrystalline material in oxide lined V-shaped walls laterally dividing a first semiconductor layer into isolated portions having a greater thickness than the oxide layer formed over the first semiconductor layer. Thus, any etching of the oxide layers to form doped regions in the first semiconductor layer using the isolation grooves in a self-aligning technique will not affect the lateral isolation. The dielectrically, laterally isolated semiconductor body is fabricated by forming a first oxide layer on the first semiconductor layer and forming an oxide inhibiting layer on the first oxide layer. The first oxide layer and oxide inhibiting layer are then masked to expose portions of the first semiconductor layer which will define the V-shaped isolation grooves. The first and second semiconductor layers are preferentially etched to form the grooves. The exposed surface of the grooves are then oxidized to form an oxide layer therein. The remainder of the grooves is filled with polycrystalline material. Sufficient polycrystalline material is removed from the grooves such that during subsequent oxidation of the polycrystalline material, a second oxide layer formed on the polycrystalline material has a top surface co-planar with the top surface of the first oxide layer. Alternatively, the polycrystalline material may be removed to any depth and the resulting second oxidized layer above the polycrystalline material may rise above the plane of the first oxide layer. During this total process, the oxide inhibiting layer prevents the first oxide layer from increasing in thickness. The polycrystalline material is oxidized until the thickness of the second oxide layer is greater than the thickness of the first oxide layer. During device formation using a self-aligning technique, the first oxide layer and a portion of a second oxide layer are removed to expose the top surface of the first semiconductor layer without exposing the top surface of the polycrystalline material. Thus, impurities can be introduced in a self-aligning technique and metal contracts made without affecting the integrity of the lateral dielectric isolation.

OBJECTS OF THE INVENTION

The object of the present invention is to provide a lateral dielectric isolation using polycrystalline fill which may be used in subsequent self-aligning device fabrication.

Another object is to provide the process for fabricating lateral dielectric isolation with polycrystalline fill which is not affected by the subsequent device formation.

A further object of the invention is a method for fabricating lateral dielectric isolation where there is no restriction on the depth of the layer to be isolated and multiple layers can be simultaneously isolated.

Other objects, advantages and novel features of the present invention will become apparant from the following detailed of the invention when considered in conjunction with the accompanying drawings.

DESCRIPTION OF THE PREFERRED EMBODIMENTS

The fabrication of the isolated semiconductor body begins with a substrate 30 formed from a first conductivity type semiconductor material such as P type single crystal silicon. N type silicon may also be used to establish the semiconductor substrate, with the conductivity of the semiconductor substrate being immaterial to the teachings of the present invention. For purpose of explanation, the substrate 30 will be assumed to be of P type silicon. If desired, a buried layer 32 of N type semiconductor material can be formed in the P type semiconductor substrate 30. Various known techniques can be used to produce the buried layer 32. For example, the buried layer may be fabricated using a standard photo masking step along with diffusion of an implanted or a deposited dopant. Photo masking refers to the conventional process of applying a layer of a photoresist polymer to a masking layer on the semiconductor substrate 30, selectively exposing the photoresist by radiation of an appropriate wave length and developing the photoresist to leave a desired pattern. The pattern is formed in the masking layer by etching. This procedure is followed by an active step such as diffusion. Next a layer 34 such as an epitaxial layer of N type single crystal silicon is epitaxially formed over the substrate 30 and the buried layer 32 to produce the semiconductor body. The process of forming the N layer by epitaxy is well known and, therefore, is neither illustrated or described in great detail herein. The invention to be described in detail is not constrained to a semiconductor substrate with a buried layer and if desired, a semiconductor substrate without a buried layer may be utilized.

Figure 2:
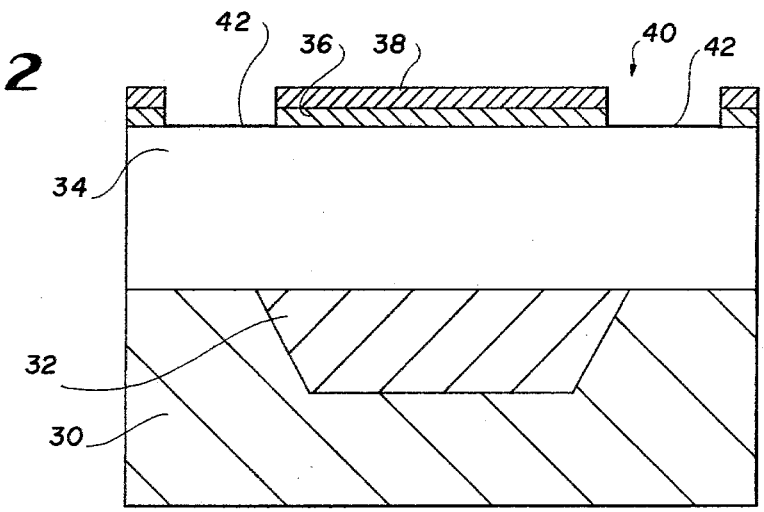
FIG. 2 through 6 are cross-sectional views of a semiconductor body at various stages of fabrication using the process of the present invention.

In accordance with the teachings of this invention, isolation grooves are formed at selected locations in the semiconductor body to provide lateral isolation between devices. A layer of silicon dioxide 36 is thermally grown on the N-type layer 34 to a thickness of approximately 0.2 microns. A thin film of material 38 capable of acting as a polishing stop and an oxide inhibitor is applied over the silicon dioxide 36. The thin hard film may be composed of silicon nitride, silicon carbide or aluminium oxide deposited to a thickness of 0.1 to 0.2 microns. An isolation pattern 40 is then defined in the oxide layer 36 and the thin layer 38 by a conventional photo masking operation to expose surface areas 42 of the epitaxial layer 34. The resulting structure is illustrated in FIG. 2.

Figure 3:
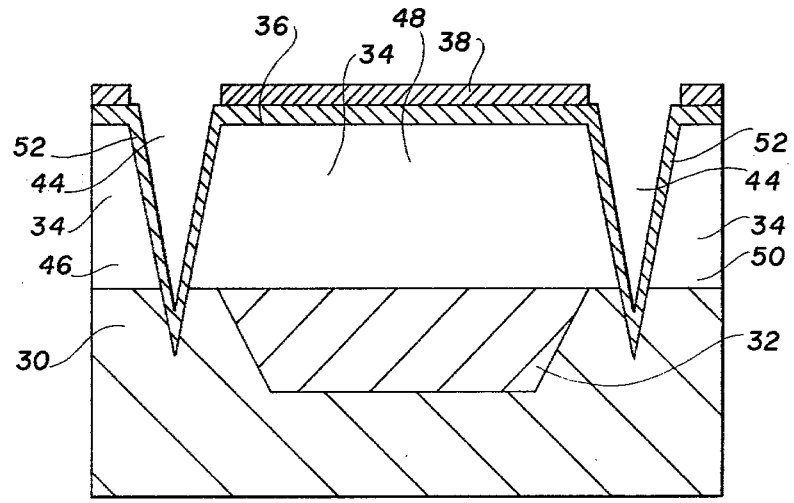

The substrate 30 and consequently the epitaxial layer 34 are selected to provide planar surface having a [100] plane crystal orientation. This crystal structure and the nature of a silicon preferential etchant are such that crystal planes falling along the [111] orientation are not readily removed. The resulting etched structure is a V-shaped groove extending down from the surface 42 into epitaxial layer 34. The depth of the groove is wholly dependent upon the lateral width of the aperture 40 in the masking layers 36 and 38. The width of the pattern 40 is selected such that the resulting groove 44 extends through the epitaxial layer 34 into the substrate 30, when the groove V's out, as illustrated in FIG. 3. The grooves 44 divide the epitaxial layer 34 to regions 46, 48 and 50 which are physically isolated from each other in the lateral direction by the grooves 44.

Figure 4:
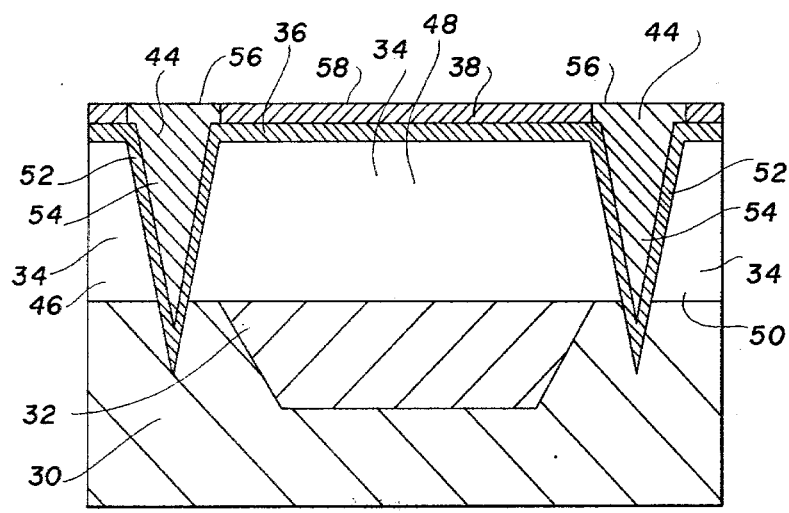

The surfaces exposed by the etchant of the epitaxial layer 34 and substrate 30 are thermally oxidized to form a silicon dioxide layer 52 of a thickness of approximately 0.2 microns. While the oxide layer 52 grows perpendicular from the exposed surface, the oxide layer 36 is extended by growth laterally to beyond the edge of the thin layer 38. The thickness of the oxide layer 36 is not increased during the oxidation step since the thin layer 38 acts as a barrier to the oxidation process. The remainder of the interior of the grooves may be filled with a suitable material 54 such as polycrystalline silicon 54 which overfills the grooves 44 and is formed on the thin layer 38. By mechanical or chemical or a combination of mechanical and chemical polishing processed, the excess polycrystalline material is removed leaving polycrystalline material 54 with a surface 56, co-planar with the surface 58 of the thin layer 38. Specific mechanical and chemical polishing processes are described in the aforementioned Morcom, et al. patent. The resulting structure is illustrated in FIG. 4.

Figure 5:
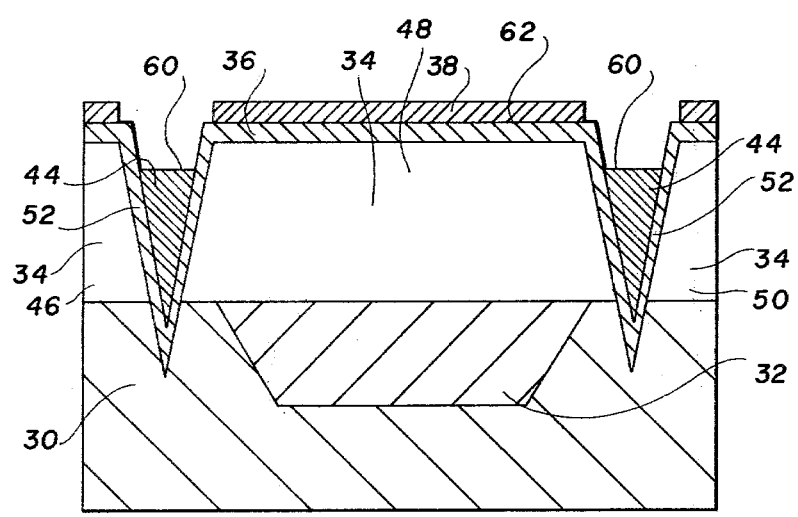
Figure 6:
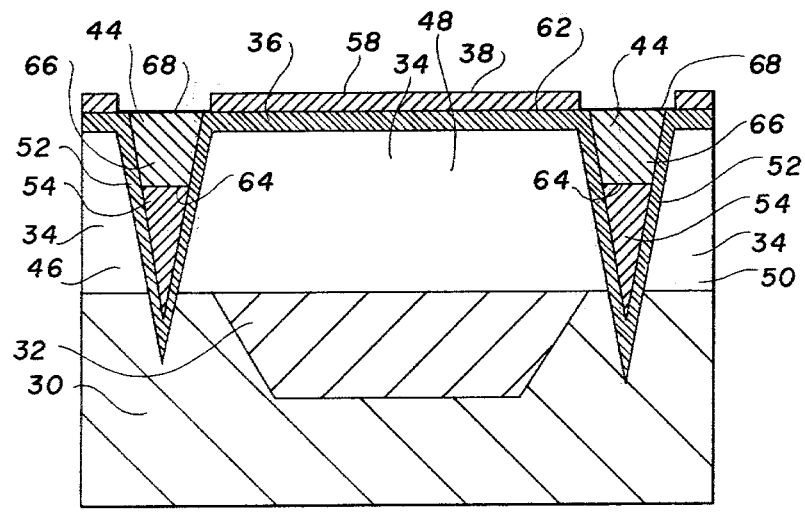

The next step in the process of the present invention is to create an oxide layer over the polycrystalline material 54 having a thickness greater than the thickness of oxide layer 36. If it is desired that the oxide layer over the polycrystalline material has a top surface coplanar with the top surface of the oxide layer 36, the surface 56 of the polished polycrystalline material 54 must be recessed below the top surface of the silicon oxide layer 36. Portions of the polycrystalline material 54 are removed by, for example, a non-preferential silicon etch to recess the top surface 56 to a new level 60 below the surface level 62 of the oxide layer 36. This structure is illustrated in FIG. 5. The polycrystalline material maybe removed by a wet chemical or a dry plasma etch. The structure is then subjected to a thermal oxidation which forms a silicon dioxide layer 66 on a surface 64 of the polycrystalline material 54 and having a planar surface 68, co-planar with the planar surface 62 of the oxide layer 36. This structure is illustrated in FIG. 6. During the total processing, the thickness of oxide layer 36 is not increased because the thin layer 38 inhibits thermal oxidation of the underlying epitaxial layer 34. The thickness of oxide layer 66 may be, for example, 0.4 microns compared to the 0.2 microns of oxide layer 36 and should be at least 0.1 microns thicker. The thin layer 38 is then removed and devices are formed in regions 46, 48 and 50.

If a non-planar surface can be tolerated, the oxide layer over the polycrystalline material 54 may be formed by thermal oxidizing the polycrystalline material without removing any of the same after polishing. The semiconductor body in the stage illustrated in FIG. 4 could be subject to an oxidizing environment to produce such a result. Depending on the ability to tolerate different levels of non-coplanarity of the oxide levels, the amount of polycrystalline material removed will be between that of a FIG. 4 type structure and that of FIG. 5. The resulting thickness of the silicon dioxide layer 66 is a function of oxidation time and the level of surface 60 prior to the oxidation.

Figure 1:
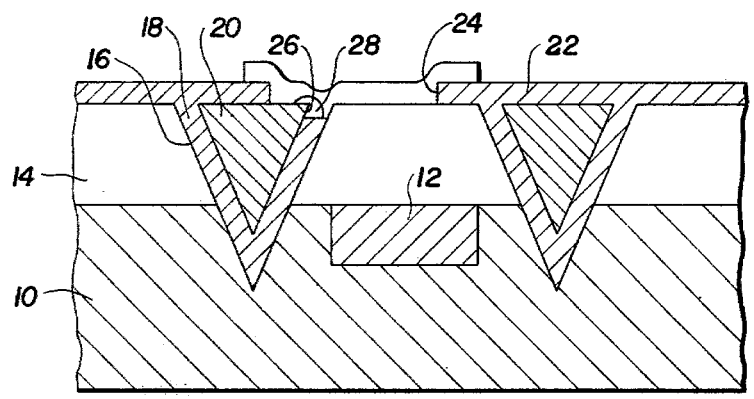
FIG. 1 is a cross-sectional view of a semiconductor structure of the prior art.
Figure 7:
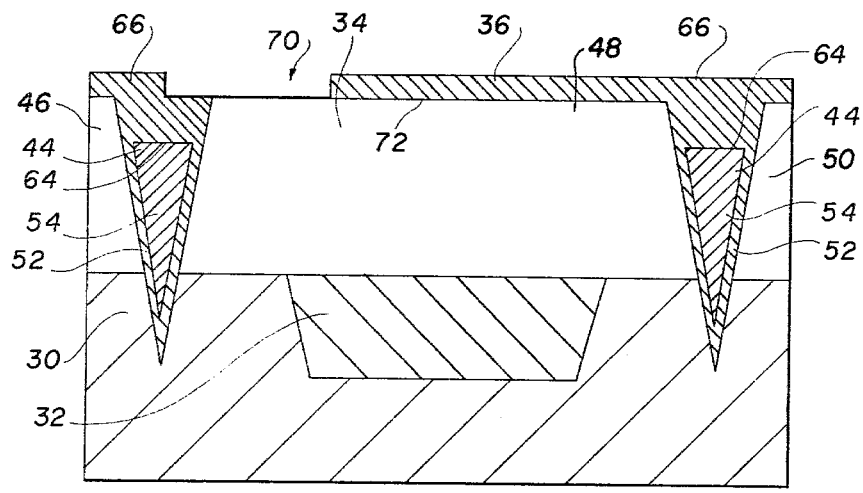
FIGS. 7 and 8 are cross-sectional views of a semiconductor structure fabricated according to the principles of the present invention during self-align device fabrication.
Figure 8:
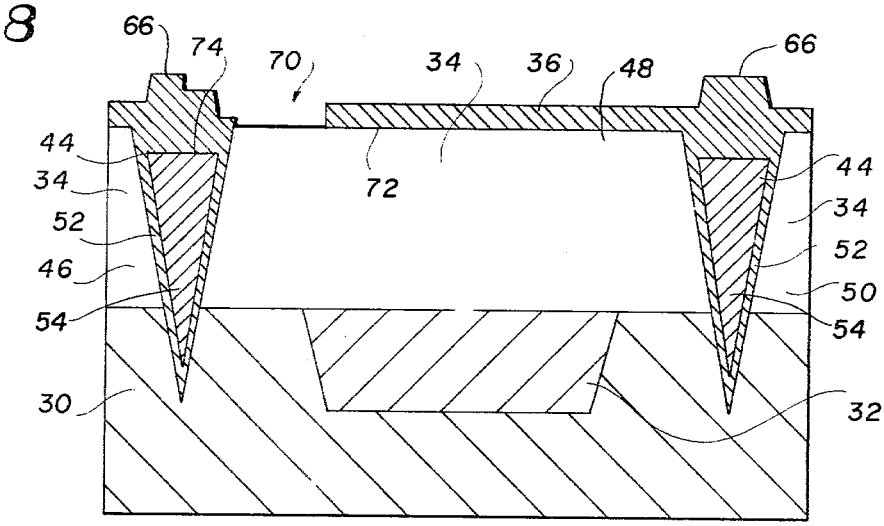

The importance of the structure of FIG. 6 to solve the problems of FIG. 1 will be illustrated in FIG. 7. The density of devices on a substrate is increased if the lateral isolation barriers created by the grooves 44 are used for self-aligned formed doped regions in the semiconductor body. This allows regions to be formed smaller than that of the resolution of the mask as well as reducing the spacing between regions since they are self-aligned wherein one boundry is defined by the epitaxial region 34's boundry with the grooves 44. The surface oxide layers 36 and 66 are masked using a standard photo lithographic technique and etched to create an opening 70. Impurities will be introduced and diffused through this opening to create a doped region in the epitaxial layer 34. Because of the relative thicknesses of the oxide layer 36 over the epitaxial layer 34 and oxide layer 66 over the polycrystalline material 54, only the surface of the epitaxial layer is exposed. The surface 64 of the polycrystalline material is still protected by the remaining portions of oxide layer 66. This protects the integrity of the polycrystalline material as well as prevent any detrimental etching of the oxide used for the lateral isolation. It should be noted that although FIG. 7 illustrates co-planar relationship between the oxide layers 36 and 66 with the surface 64 of polycrystalline material 54 recessed below the surface 72 of epitaxial layer 34, the same principles of the present process result even if the resulting top surfaces of oxide layers 36 and 66 are not co-planar. This is illustrated in FIG. 8 wherein the epitaxial layer is exposed through openings 70 and the surface 74 of the polycrystalline material 44 is not exposed.

Figure 9:
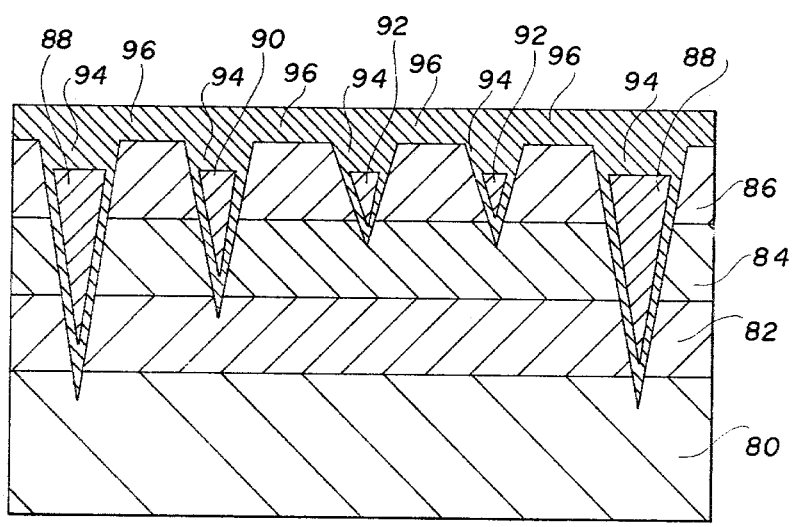
FIG. 9 is a cross-sectional view of another semiconductor structure fabricated according to the principles of the present invention.

The principles of the present invention are also applicable to a plurality of layers using a plurality of vertical grooves to laterally isolate regions in the plurality of layers. This illustrated in FIG. 9 wherein substrate 80 has three layers 82, 84 and 86 formed thereon and upon each other. The deepest grooves 88 are formed through the layers 82, 84 and 86 into the substrate 80. An intermediate depth groove 90 is formed through layers 84 and 86 into layer 82. The shallowest grooves 92 are formed through the layer 86 and to layer 84. As illustrated, the oxide portion 94 above the polycrystalline portion of the grooves is thicker than the surface oxide layer 96 formed on layer 86. Because of the unique crystalline orientation and anisotropic silicon etchant employed in the present process, the grooves may be formed simultaneously since their depths are a function of the opening in the mask. The exposed portions of layer 86 for grooves 88 are the largest with 90 being the next largest and that for 92 being the smallest. The period of etching should be sufficiently long to ensure that the groove 88 is etched down through layers 82, 84 and 86 and into substrate 80. Since etching effectively stops when the grooves V out, the exact period of etching for the various depths is not critical. This technique can be used to form grooves whose depth does not exceed the thickness of a top layer. These grooves can be used as self-align lateral barriers for intra-device doped regions.

From the preceeding description of the preferred embodiments, it is evident that the objects of the invention are attained in that a laterally dielectrically isolated semiconductor body is provided which may be used in a self-aligning, bipolar transistor process without degregation of the integrity of the lateral isolation. Although the invention has been described and illustrated in detail, it is to be clearly understood that the same is by way of illustration and example only and is not be taken by way of limitation. The spirit and scope of this invention is to be limited only by the terms of the appended claims.

What is claimed:

1. A process for laterally isolating portions of a first semiconductor layer of a first conductivity type formed on a second semiconductor layer of a second conductivity type comprising:

forming a first oxide layer on said first semiconductor layer of a first thickness;

forming an oxide inhibiting mask layer on said first oxide layer;

removing portions of said mask layer and said first oxide layer to expose surface areas of said first semiconductor layer;

preferentially etching the exposed area of said first and second semiconductor layers to form grooves extending through said first semiconductor layer into said second semiconductor layer;

forming a second oxide layer on exposed surfaces of said grooves of a second thickness;

depositing polycrystalline material on said second oxide layer in said grooves to substantially fill said grooves; and selectively oxidizing said polycrystalline material to form a third oxide layer of a third thickness greater than said first thickness.

2. The process according to claim 1 wherein said depositing is performed to overfill said grooves at least to the height of said mask layer, including removing a portion of said polycrystalline material to recess the top surface of said polycrystalline material below the top surface of said first oxide layer, and wherein said selective oxidation is performed sufficient to form a co-planar surface with said first oxide layer.

3. The process according to claim 1 wherein said third oxide layer is at least 0.1 microns thicker than said first oxide layer.

4. The process according to claim 1 wherein said first and second semiconductor layers are single crystal silicon, said polycrystalline material is polysilicon, and said oxide layers are silicon dioxide.

5. The process according to claim 1 wherein said removing step is performed to form additional apertures of cross-sectional area insufficient to produce a groove when preferentially etched to exceed the thickness of said first semiconductor layer.

6. The process according to claim 1 including a third semiconductor layer of said first conductivity type below said second semiconductor; and wherein said removing step is performed to form additional apertures of cross-sectional area sufficient to produce a groove when preferentially etched to exceed the thickness of said first and second semiconductor layers.

7. A process for laterall isolating portions of a first semiconductor layer of a first conductivity type formed on a second semiconductor layer of a second conductivity type comprising:

forming a first oxide layer on said first semiconductor layer;

forming an oxide inhibiting layer on said first oxide layer;

removing portions of said oxide layer, said oxide inhibiting layer, said first semiconductor layer and said second semiconductor layer to form grooves extending through said first semiconductor layer into said second semiconductor layer;

forming a second oxide layer on the exposed surfaces of said grooves;

substantially filling the grooves with polycrystalline material; and oxidizing the polycrystalline material to form a third oxide layer having a thickness greater than the thickness of the first oxide layer.

8. The process according to claim 7 including removing portions of said polycrystalline material to recess the top surface of said polycrystalline material below the top surface of said first oxide layer; and said oxidizing is performed sufficient to form a co-planar surface with said first oxide layer.

9. The process according to claim 7 including removing an equal thickness of said first and third oxide layers to expose a portion of the surface of said first oxide layer adjacent said groove without exposing said polycrystalline material in said groove and forming a doped region in said exposed portion of first semiconductor layer.

* * * * *

UNITED STATES PATENT AND TRADEMARK OFFICE
CERTIFICATE OF CORRECTION

PATENT NO. : 4,255,207
DATED : March 10, 1981
INVENTOR(S) : Hugh C. Nicolay et al It is certified that error appears in the above—identified patent and that said Letters Patent is hereby corrected as shown below:

Column 1, line 53, delete "Poyplanar" and insert therefor -- Polyplanar --.

Column 2, line 41, delete "undersirous" and insert therefor -- undesirous --.

Column 3, line 35, delete "contracts" and insert therefor -- contacts --.

Column 3, line 53, after the word "detailed", insert -- description --.

Column 3, line 59, delete "FIG." and insert therefor -- FIGS. --.

Column 4, lines 43-44, delete "aluminium" and insert therefor -- aluminum --.

Column 5, line 2, delete "perpenducular" and insert therefor -- perpendicular --.

Column 5, line 12, delete "processed" and insert therefor -- processes --.

Column 5, line 32, delete "maybe" and insert therefor -- may be --.

Column 5, line 67, delete "boundry" and insert therefor -- boundary --.

Column 5, line 68, delete "boundry" and insert therefor -- boundary --.

UNITED STATES PATENT AND TRADEMARK OFFICE
CERTIFICATE OF CORRECTION

PATENT NO. : 4,255,207
DATED : March 10, 1981
INVENTOR(S) : Hugh C. Nicolay et al It is certified that error appears in the above—identified patent and that said Letters Patent is hereby corrected as shown below:

Column 6, lines 11-12, delete "prevent" and insert therefor -- prevents --.

Column 6, line 26, after "this" insert -- is --.

Column 6, line 52, delete "preceeding" and insert therefor -- preceding --.

Claim 7, line 1, delete "laterall" and insert therefor -- laterally --.

Signed and Sealed this

Twenty-first Day of July 1981

[SEAL]

Attest:

Attesting Officer

GERALD J. MOSSINGHOFF
Commissioner of Patents and Trademarks